(12) United States Patent
Zhang (10) Patent No.: US 10,714,172 B2
(45) Date of Patent: Jul. 14, 2020

(54) BI-SIDED PATTERN PROCESSOR

(71) Applicant: Guobiao Zhang, Corvallis, OR (US)

(72) Inventor: Guobiao Zhang, Corvallis, OR (US)

(73) Assignees: HangZhou HaiCun Information Technology Co., Ltd., HangZhou, ZheJiang (CN); Guobiao Zhang, Corvallis, OR (US)

( * ) Notice: Subject to any disclaimer, the term of this patent is extended or adjusted under 35 U.S.C. 154(b) by 0 days.

(21) Appl. No.: 16/248,933

(22) Filed: Jan. 16, 2019

(65) Prior Publication Data

US 2019/0180815 A1    Jun. 13, 2019

(30) Foreign Application Priority Data

Dec. 11, 2018 (CN) .......................... 2018 1 1508130
Jan. 13, 2019 (CN) .......................... 2019 1 0029514

(51) Int. Cl.
| | | |
|---|---|---|
| *G11C 17/00* | (2006.01) | |
| *G11C 11/56* | (2006.01) | |
| *G11C 17/14* | (2006.01) | |
| *H01L 27/06* | (2006.01) | |
| *H01L 27/112* | (2006.01) | |

(52) U.S. Cl.
CPC .......... *G11C 11/5692* (2013.01); *G11C 17/14* (2013.01); *H01L 27/0694* (2013.01); *H01L 27/11213* (2013.01)

(58) Field of Classification Search
CPC . G11C 11/5692; G11C 17/14; H01L 27/0694; H01L 27/11213

USPC .................................................. 365/94–105
See application file for complete search history.

(56) References Cited

U.S. PATENT DOCUMENTS

| | | | |
|---|---|---|---|
| 5,440,749 A | 8/1995 | Moore et al. | |
| 5,835,396 A | 11/1998 | Zhang | |
| 6,034,882 A | 3/2000 | Johnson et al. | |
| 6,351,406 B1 | 2/2002 | Johnson et al. | |
| 6,717,222 B2 | 4/2004 | Zhang | |
| 6,861,715 B2 | 3/2005 | Zhang | |
| 7,158,220 B2 | 1/2007 | Zhang | |
| 7,188,369 B2 | 3/2007 | Ho et al. | |
| 7,468,667 B2 | 12/2008 | Moffett | |
| 7,523,500 B1 | 4/2009 | Szor et al. | |
| 7,716,051 B2 | 5/2010 | Dow et al. | |
| 7,831,606 B2 | 11/2010 | Pandya | |

(Continued)

OTHER PUBLICATIONS

Paul et al., "An Efficient and Scalable Semiconductor Architecture for Parallel Automata Processing", IEEE Transactions on Parallel and Distributed Systems, vol. 25, No. 12, pp. 3088-3098, 2014.

(Continued)

*Primary Examiner* — Harry W Byrne (57) ABSTRACT

A bi-sided pattern processor comprises a plurality of storage-processing units (SPU's). Each of the SPU's comprises at least a memory array and a pattern-processing circuit. The preferred pattern processor further comprises a semiconductor substrate with opposing first and second surfaces. The memory array is disposed on the first surface, whereas the pattern-processing circuit is disposed on the second surface. The memory array stores patterns; the pattern-processing circuit processes these patterns; and, they are communicatively coupled by a plurality of inter-surface connections.

20 Claims, 5 Drawing Sheets

(56) References Cited

U.S. PATENT DOCUMENTS

| | | |
|---|---|---|
| 7,839,854 B2 | 11/2010 | Alexander |
| 7,853,689 B2 | 12/2010 | Enderby |
| 7,854,008 B1 | 12/2010 | Huang et al. |
| 8,281,395 B2 | 10/2012 | Powlowski |
| 8,327,446 B2 | 12/2012 | Liang et al. |
| 8,365,287 B2 | 1/2013 | Yoo |
| 8,392,989 B2 | 3/2013 | Upadhyay |
| 8,640,237 B2 | 1/2014 | Haeffele et al. |
| 8,726,362 B2 | 5/2014 | Yoo |
| 8,973,130 B2 | 3/2015 | Yoo |
| 9,064,114 B2 | 6/2015 | Hamid |
| 9,196,247 B2 | 11/2015 | Harada |
| 9,407,648 B1 | 8/2016 | Pavlyushchik et al. |
| 9,436,824 B1 | 9/2016 | Levchenko et al. |
| 2006/0242710 A1 | 10/2006 | Alexander |
| 2009/0044273 A1 | 2/2009 | Zhou et al. |
| 2012/0089857 A1* | 4/2012 | Sharma ............... G06F 13/1689 713/503 |

OTHER PUBLICATIONS

Paul et al, "MAHA: An Energy-Efficient Malleable Hardware Accelerator for Data-Intensive Applications", Very Large Scale Integration (VLSI) Systems, IEEE Transactions on, vol. 23, No. 6, pp. 1005-1016, 2015.

Karam et al, "Emerging Trends in Design and Applications of Memory-Based Computing and Content-Addressable Memories", Proceedings of the IEEE, vol. 103, issue 8, pp. 1311-1330, 2015.

* cited by examiner

BI-SIDED PATTERN PROCESSOR

CROSS-REFERENCE TO RELATED APPLICATIONS

This application claims priority from Chinese Patent Application No. 201910029514.2, filed Jan. 13, 2019, in the State Intellectual Property Office of the People's Republic of China (CN), the disclosure of which is incorporated herein by references in their entireties.

BACKGROUND

1. Technical Field of the Invention

The present invention relates to the field of integrated circuit, and more particularly to a pattern processor.

2. Prior Art

Pattern processing includes pattern matching and pattern recognition, which are the acts of searching a target pattern (i.e. the pattern to be searched) for the presence of the constituents or variants of a search pattern (i.e. the pattern used for searching). The match usually has to be "exact" for pattern matching, whereas it could be "likely to a certain degree" for pattern recognition. As used hereinafter, search patterns and target patterns are collectively referred to as patterns; pattern database refers to a database containing related patterns. Pattern database includes search-pattern database (also known as search-pattern library) and target-pattern database.

Pattern processing has broad applications. Typical pattern processing includes code matching, string matching, speech recognition and image recognition. Code matching is widely used in information security. Its operations include searching a virus in a network packet or a computer file; or, checking if a network packet or a computer file conforms to a set of rules. String matching, also known as keyword search, is widely used in big-data analytics. Its operations include regular-expression matching. Speech recognition identifies from the audio data the nearest acoustic/language model in an acoustic/language model library. Image recognition identifies from the image data the nearest image model in an image model library.

The pattern database has become large: the search-pattern library (including related search patterns, e.g. a virus library, a keyword library, an acoustic/language model library, an image model library) is already big; while the target-pattern database (including related target patterns, e.g. computer files on a whole disk drive, a big-data database, an audio archive, an image archive) is even bigger. The conventional processor and its associated von Neumann architecture have great difficulties to perform fast pattern processing on large pattern databases.

OBJECTS AND ADVANTAGES

It is a principle object of the present invention to improve the speed and efficiency of pattern processing on large pattern databases.

It is a further object of the present invention to enhance information security.

It is a further object of the present invention to improve the speed and efficiency of big-data analytics.

It is a further object of the present invention to improve the speed and efficiency of speech recognition, as well as enable audio search in an audio archive.

It is a further object of the present invention to improve the speed and efficiency of image recognition, as well as enable video search in a video archive.

In accordance with these and other objects of the present invention, the present invention discloses a bi-sided pattern processor.

SUMMARY OF THE INVENTION

The present invention discloses a bi-sided pattern processor. Its basic functionality is pattern processing. More importantly, the patterns it processes are stored locally. The preferred pattern processor comprises a plurality of storage-processing units (SPU's). Each of the SPU's comprises at least a memory array for storing at least a portion of a pattern and a pattern-processing circuit for performing pattern processing for the pattern. The preferred pattern processor comprises a semiconductor substrate with opposing first and second surfaces. The memory array is disposed on the first surface; the pattern-processing circuit is disposed on the second surface; and, the memory array and the pattern-processing circuit are communicatively coupled by a plurality of intra-surface connections.

The type of integration between the memory array and the pattern-processing circuit is referred to as double-sided integration. The double-sided integration offers many advantages over the conventional 2-D integration, where the memory array and the processing circuit are placed side-by-side on the substrate of a processor die.

First, for the double-sided integration, the footprint of the SPU is the larger one of the memory array and the pattern-processing circuit. In contrast, for the 2-D integration, the footprint of a conventional processor is the sum of the memory array and the pattern-processing circuit. Hence, the SPU of the present invention is smaller. With a smaller SPU, the preferred pattern processor comprises a larger number of SPU's, typically on the order of thousands to tens of thousands. Because all SPU's can perform pattern processing simultaneously, the preferred pattern processor supports massive parallelism.

Moreover, for the double-sided integration, the memory array is in close proximity to the pattern-processing circuit. Because the through-silicon vias (TSV's) between the memory array and the pattern-processing circuit are short (tens to hundreds of microns) and numerous (thousands), fast intra-surface connections can be achieved. In compassion, for the 2-D integration, because the memory array is distant from the processing circuit, the wires coupling them are long (hundreds of microns to millimeters) and few (e.g. 64-bit).

Accordingly, the present invention discloses a bi-sided pattern processor, comprising: an input for transferring a first portion of a first pattern; a plurality of storage-processing units (SPU's) communicatively coupled with said input, each of said SPU's comprising at least a memory array and a pattern-processing circuit, wherein said memory array stores at least a second portion of a second pattern, said pattern-processing circuit performs pattern processing for said first and second patterns; a semiconductor substrate with first and second surfaces, wherein said memory array is disposed on said first surface, said pattern-processing circuit is disposed on said second surface, said memory array and said pattern-processing circuit are communicatively coupled by a plurality of inter-surface connections.

It should be noted that all the drawings are schematic and not drawn to scale. Relative dimensions and proportions of parts of the device structures in the figures have been shown exaggerated or reduced in size for the sake of clarity and convenience in the drawings. The same reference symbols are generally used to refer to corresponding or similar features in the different embodiments.

As used hereinafter, the symbol "/" means the relationship of "and" or "or". The phrase "memory" is used in its broadest sense to mean any semiconductor device, which can store information for short term or long term. The phrase "memory array" is used in its broadest sense to mean a collection of all memory cells sharing at least an address line. The phrase "communicatively coupled" is used in its broadest sense to mean any coupling whereby electrical signals may be passed from one element to another element. The phrase "pattern" could refer to either pattern per se, or the data related to a pattern; the present invention does not differentiate them.

DETAILED DESCRIPTION OF THE PREFERRED EMBODIMENTS

Those of ordinary skills in the art will realize that the following description of the present invention is illustrative only and is not intended to be in any way limiting. Other embodiments of the invention will readily suggest themselves to such skilled persons from an examination of the within disclosure.

The present invention discloses a bi-sided pattern processor. Its basic functionality is pattern processing. More importantly, the patterns it processes are stored locally. The preferred pattern processor comprises a plurality of storage-processing units (SPU's). Each of the SPU's comprises at least a memory array for storing at least a portion of a pattern and a pattern-processing circuit for performing pattern processing for the pattern. The preferred pattern processor comprises a semiconductor substrate with opposing first and second surfaces. The memory array is disposed on the first surface; the pattern-processing circuit is disposed on the second surface; and, the memory array and the pattern-processing circuit are communicatively coupled by a plurality of intra-surface connections.

Figure 1A:
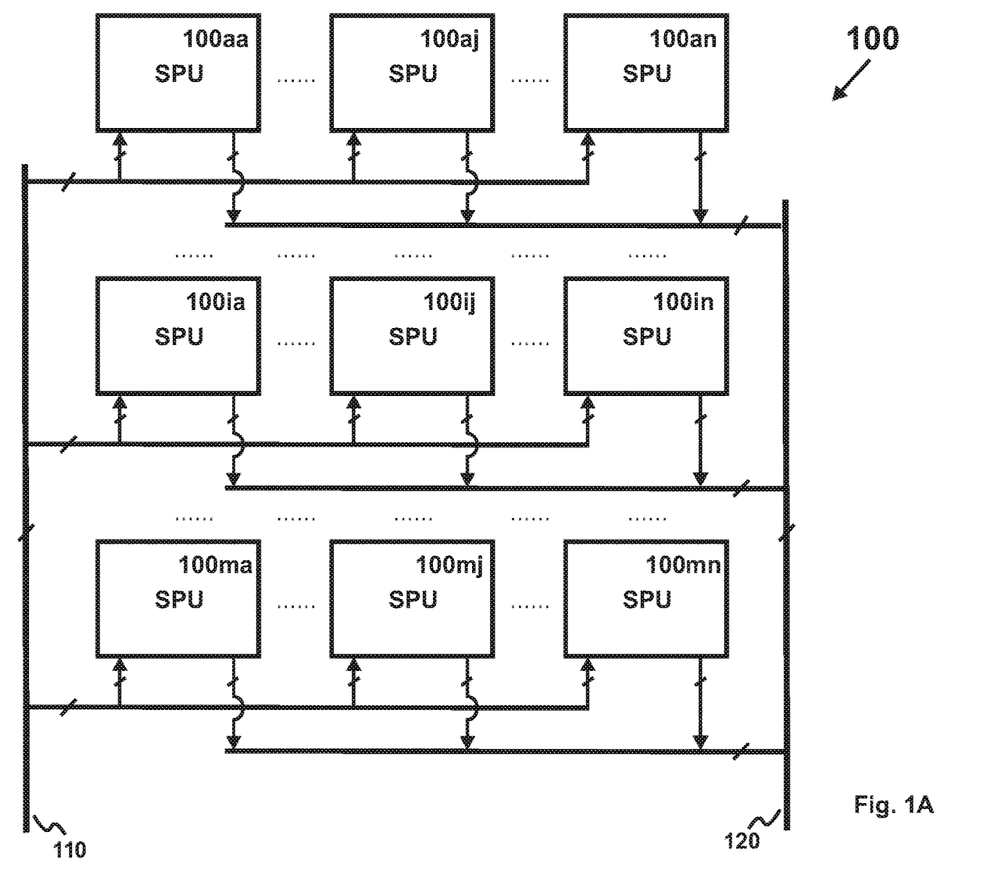
FIG. 1A is a circuit block diagram of a preferred bi-sided pattern processor.
Figure 1B:
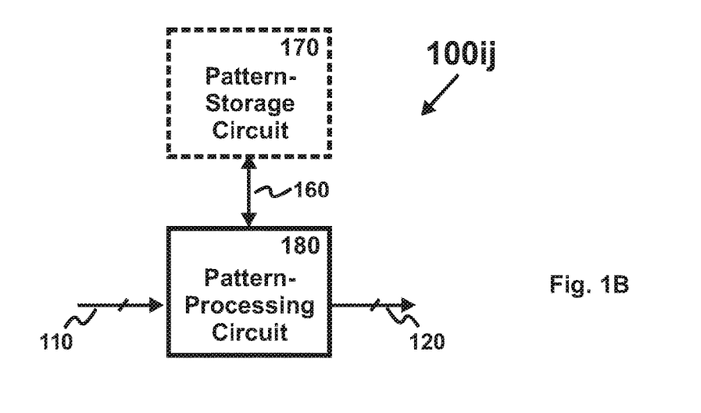
FIG. 1B is a circuit block diagram of a preferred storage-processing unit (SPU)

Referring now to FIGS. 1A-1B, an overview of a preferred bi-sided pattern processor 100 is disclosed. FIG. 1A is its circuit block diagram. The preferred bi-sided pattern processor 100 not only processes patterns, but also stores patterns. It comprises an array with m rows and n columns (m×n) of storage-processing units (SPU's) 100aa-100mn. Using the SPU 100ij as an example, it has an input 110 and an output 120. In general, the preferred bi-sided pattern processor 100 comprises thousands to tens of thousands of SPU's 100aa-100mn and therefore, supports massive parallelism.

FIG. 1B is a circuit block diagram of a preferred SPU 100ij. The SPU 100ij comprises a pattern-storage circuit 170 and a pattern-processing circuit 180, which are communicatively coupled by inter-surface connections 160 (referring to FIG. 2C). The pattern-storage circuit 170 comprises a plurality of memory arrays for storing patterns, whereas the pattern-processing circuit 180 processes these patterns. The memory array 170 could be a RAM array or a ROM array. The RAM array could be an SRAM array or a DRAM array. The ROM array could be a mask-ROM array, an OTP array, an EPROM array, an EEPROM array, a flash memory array or a 3-D memory (3D-M) array. Because it is disposed on a different surface than the pattern-processing circuit 180, the memory array 170 is drawn by dashed lines.

Figure 2A:
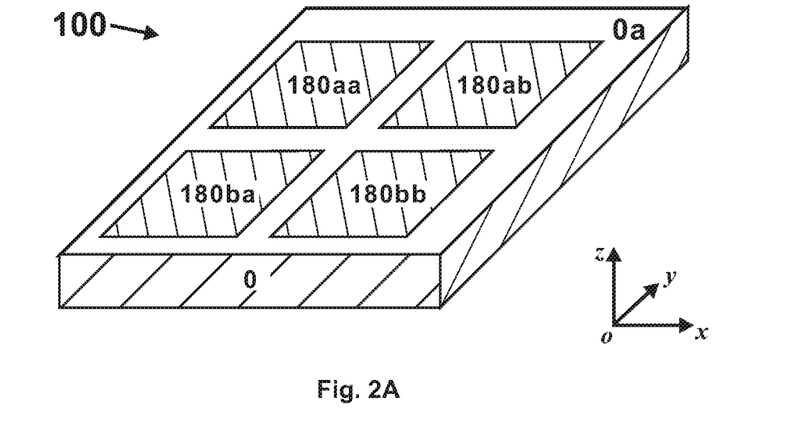
FIG. 2A is a perspective view of a first surface of the preferred bi-sided pattern processor.
Figure 2B:
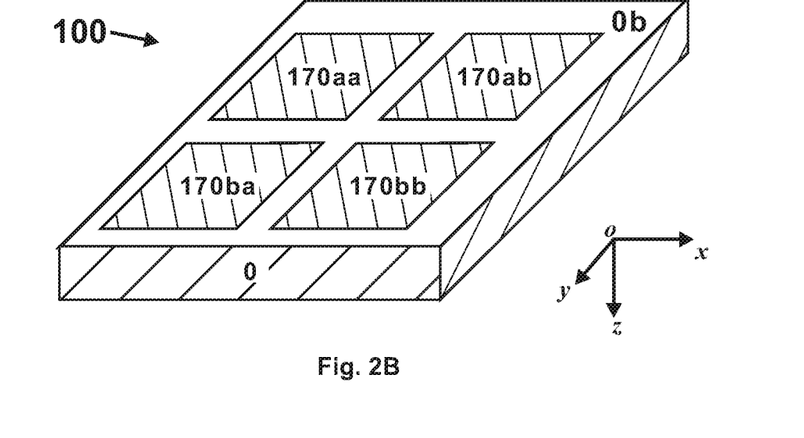
FIG. 2B is a perspective view of its second surface.
Figure 2C:
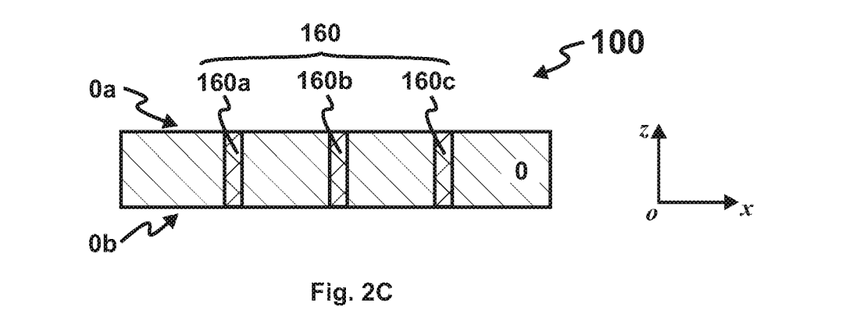
FIG. 2C is its cross-sectional view.

Referring now to FIGS. 2A-2C, more details of the preferred bi-sided pattern processor 100 are shown. It is formed on a semiconductor substrate 0 with a first surface 0a and a second surface 0b. The pattern-processing circuits 180aa-180bb . . . are disposed on the first surface 0a (FIG. 2A). On the other hand, the memory arrays 170aa-170bb . . . are disposed on the second surface 0b (FIG. 2B). This preferred pattern processor 100 adopts an "all-matching" design, i.e. the circuits on the first and second surfaces 0a, 0b are designed in such a way that each memory array is vertically aligned and communicatively coupled with a pattern-processing circuit. Because each pattern-processing circuit can be vertically aligned and communicatively coupled with multiple memory arrays (referring to FIGS. 4B-4C), the pitch of the pattern-processing circuit 180 on the second surface 0b is an integer multiple of that of the memory array 170 on the first surface 0a. The pattern-processing circuits 180aa-180bb and the memory arrays 170aa-170bb are communicatively coupled by a plurality of inter-surface connections 160 (FIG. 2C). Exemplary inter-surface connections 160 include through-silicon vias (TSV's) 160a-160c. As is well known in the art, these TSV's 160a-160c penetrate through the semiconductor substrate 0 and form electrical connections between circuits disposed on opposing surfaces.

In the preferred embodiments of FIGS. 2A-2C, the memory array 170 and the pattern-processing circuit 180 are disposed on opposing surfaces of the semiconductor substrate 0. This type of integration is referred to as double-sided integration. The double-sided integration offers many advantages over the conventional 2-D integration, where the memory array and the processing circuit are placed side-by-side on the substrate of a conventional processor die.

First, for the double-sided integration, the footprint of the SPU 100ij is the larger one of the memory array 170 and the pattern-processing circuit 180. In contrast, for the 2-D integration, the footprint of a conventional processor is the sum of the memory array and the pattern-processing circuit. Hence, the SPU 100ij of the present invention is smaller. With a smaller SPU 100ij, the preferred pattern processor 100 comprises a larger number of SPU's, typically on the order of thousands to tens of thousands. Because all SPU's can perform pattern processing simultaneously, the preferred pattern processor 100 supports massive parallelism.

Moreover, for the double-sided integration, the memory array 170 is in close proximity to the pattern-processing circuit 180. Because the through-silicon vias (TSV's) 160a-160c between the memory array 170 and the pattern-processing circuit 180 are short (tens to hundreds of microns) and numerous (thousands), fast intra-surface connections 160 can be achieved. In compassion, for the 2-D integration, because the memory array is distant from the processing circuit, the wires coupling them are long (hundreds of microns to millimeters) and few (e.g. 64-bit).

Figure 3A:
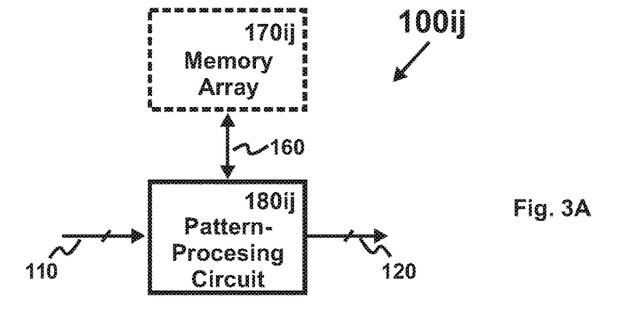
FIGS. 3A-3C are circuit block diagrams of three preferred SPU's.
Figure 3B:
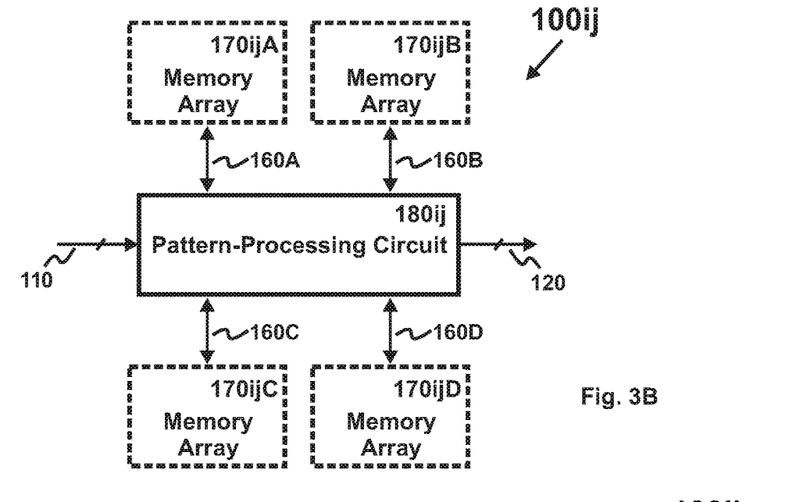
Figure 3C:
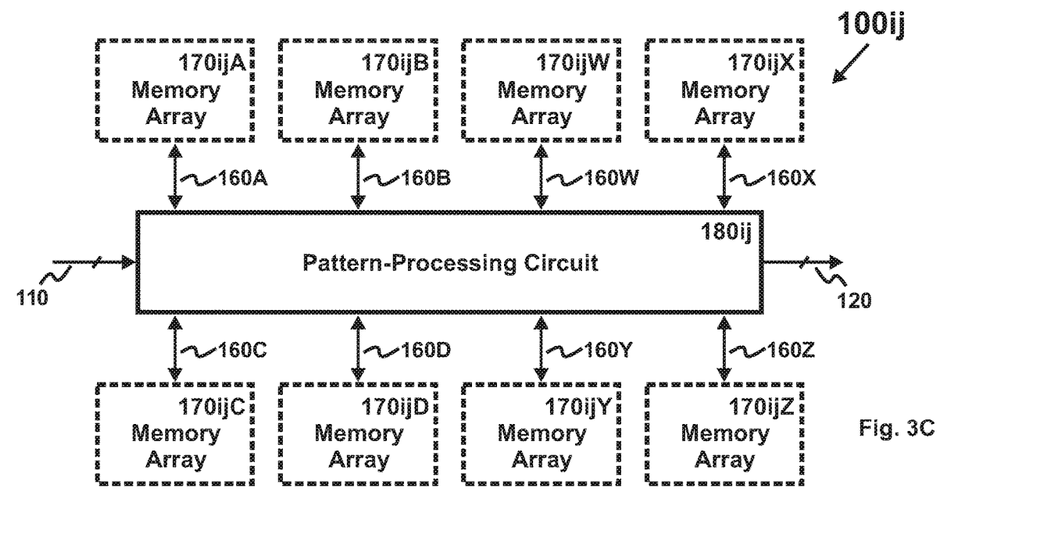
Figure 4A:
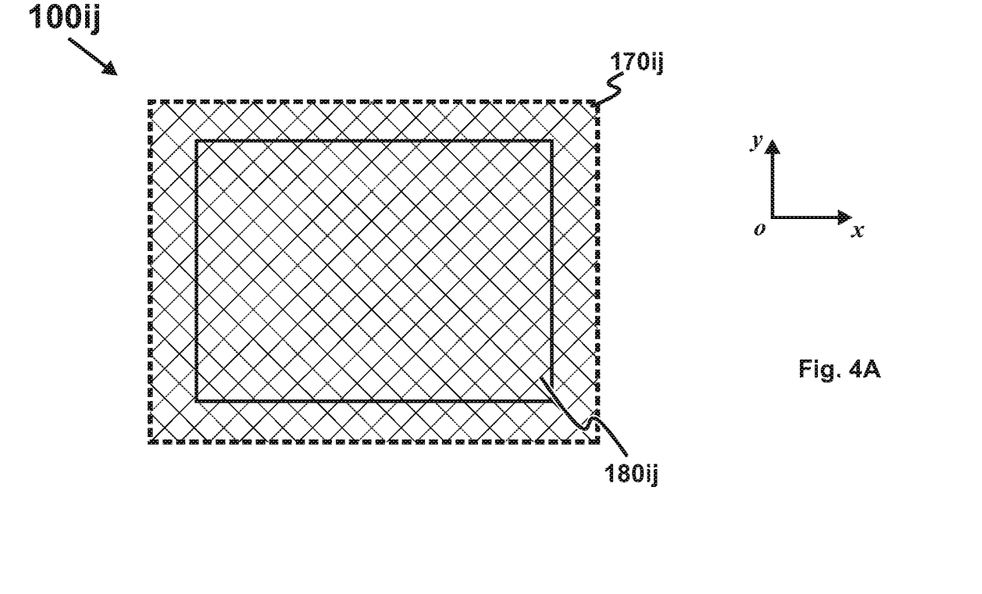
FIGS. 4A-4C are circuit layout views of three preferred SPU's on the second surface.
Figure 4B:
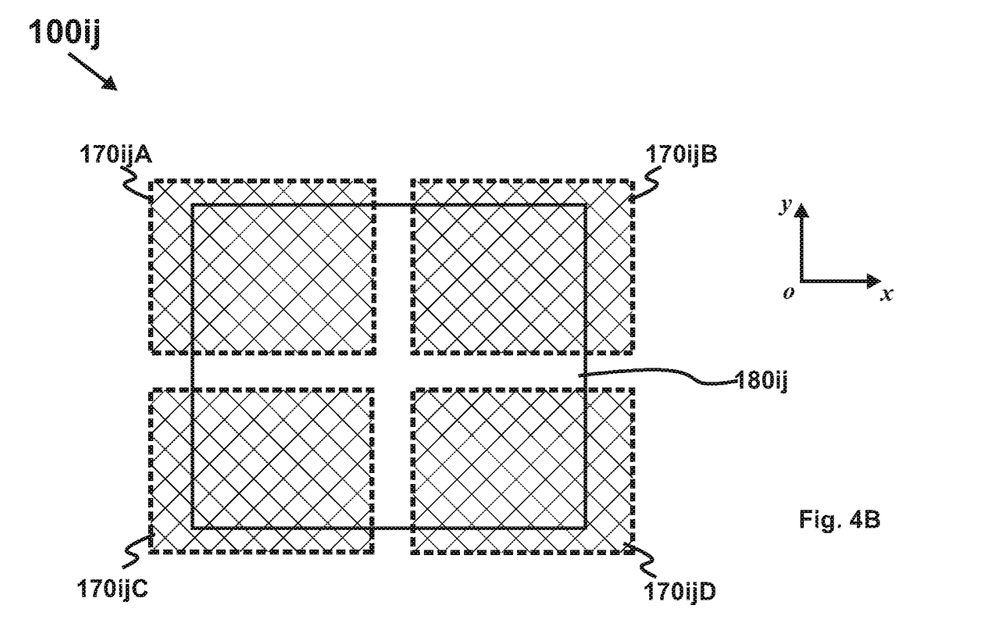
Figure 4C:
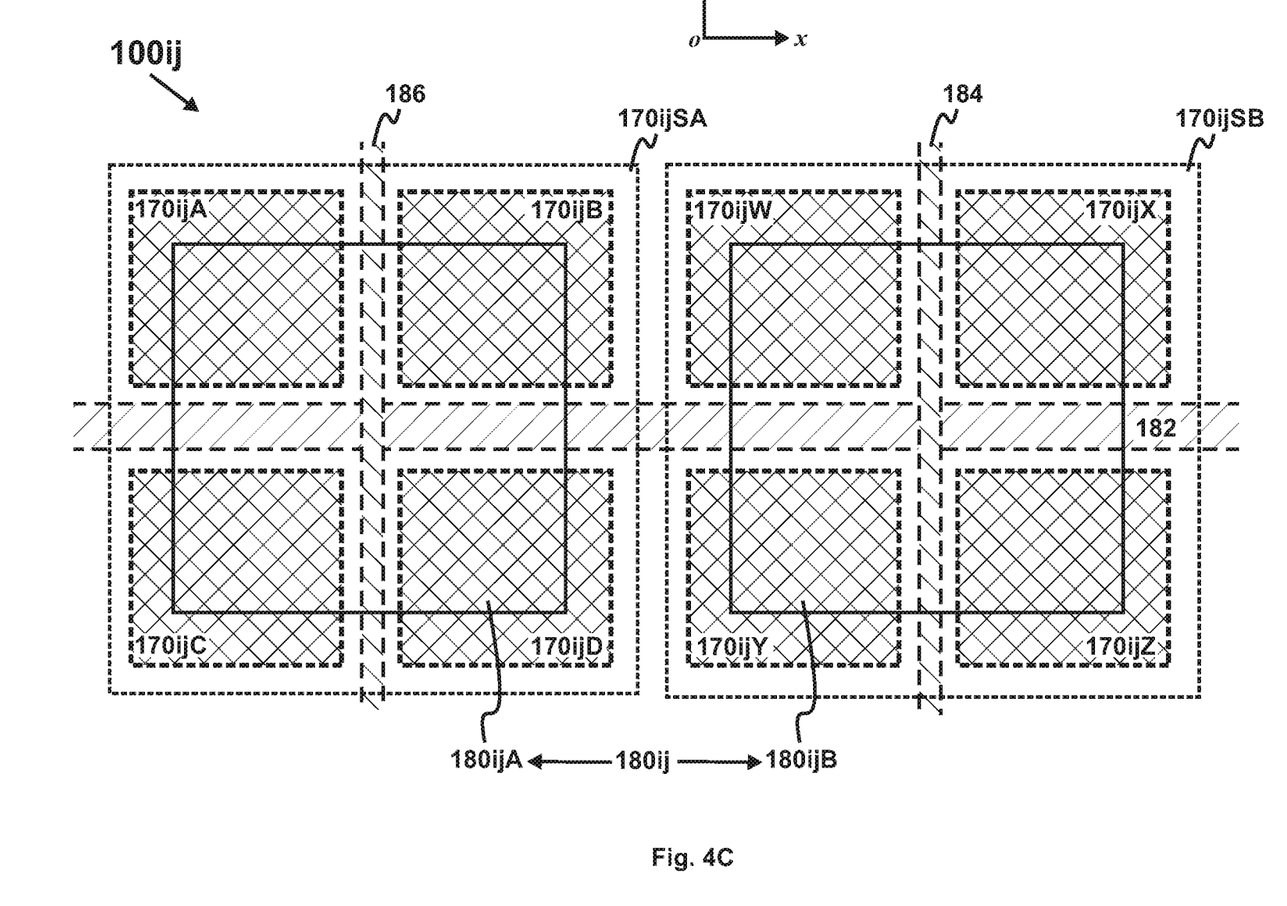

Referring now to FIGS. 3A-4C, three preferred SPU 100*ij* are shown. FIGS. 3A-3C are their circuit block diagrams and FIGS. 4A-4C are their circuit layout views. In these preferred embodiments, a pattern-processing circuit 180*ij* serves different number of memory arrays 170*ij*.

In FIG. 3A, the pattern-processing circuit 180*ij* serves one memory array 170*ij*, i.e. it processes the patterns stored in the memory array 170*ij*. In FIG. 3B, the pattern-processing circuit 180*ij* serves four memory arrays 170*ij*A-170*ij*D, i.e. it processes the patterns stored in the memory arrays 170*ij*A-170*ij*D. In FIG. 3C, the pattern-processing circuit 180*ij* serves eight memory array 170*ij*A-170*ij*D, 170*ij*W-170*ij*Z, i.e. it processes the patterns stored in the memory array 170*ij*A-170*ij*D, 170*ij*W-170*ij*Z. As will become apparent in FIGS. 4A-4C, the more memory arrays it serves, a larger area and more functionalities the pattern-processing circuit 180*ij* will have. In FIGS. 3A-4C, because they are located on a different surface 0*a* than the pattern-processing circuit 180*ij* (referring to FIGS. 2A-2C), the memory arrays 170*ij*-170*ij*Z are drawn by dashed lines.

FIGS. 4A-4C disclose the circuit layouts of the second surface 0*b*, as well as the projections of the memory arrays 170*ij*-170*ij*Z (physically located on the first surface 0*a*) on the second surface 0*b* (drawn by dashed lines). The embodiment of FIG. 4A corresponds to that of FIG. 3A. In this preferred embodiment, the pattern-processing circuit 180*ij* is disposed on the second surface 0*b*. It is at least partially covered by the memory array 170*ij*.

In this preferred embodiment, the pitch of the pattern-processing circuit 180*ij* is equal to the pitch of the memory array 170*ij*. Because its area is smaller than the footprint of the memory array 170*ij*, the pattern-processing circuit 180*ij* has limited functionalities. FIGS. 4B-4C discloses two complex pattern-processing circuits 180*ij*.

The embodiment of FIG. 4B corresponds to that of FIG. 3B. In this preferred embodiment, the pattern-processing circuit 180*ij* is disposed on the second surface 0*b*. It is at least partially covered by the memory arrays 170*ij*A-170*ij*D. Below the four memory arrays 170*ij*A-170*ij*D, the pattern-processing circuit 180*ij* can be laid out freely. Because the pitch of the pattern-processing circuit 180*ij* is twice as much as the pitch of the memory arrays 170*ij*, the pattern-processing circuit 180*ij* is four times larger than the footprints of the memory arrays 170*ij* and therefore, has more complex functionalities.

The embodiment of FIG. 4C corresponds to that of FIG. 3C. In this preferred embodiment, the pattern-processing circuit 180*ij* is disposed on the second surface 0*b*. These memory arrays 170*ij*A-170*ij*D, 170*ij*W-170*ij*Z are divided into two sets: a first set 170*ij*SA includes four memory arrays 170*ij*A-170*ij*D, and a second set 170*ij*SB includes four memory arrays 170*ij*W-170*ij*Z. Below the four memory arrays 170*ij*A-170*ij*D of the first set 170*ij*SA, a first component 180*ij*A of the pattern-processing circuit 180*ij* can be laid out freely. Similarly, below the four memory array 170*ij*W-170*ij*Z of the second set 170*ij*SB, a second component 180*ij*B of the pattern-processing circuit 180*ij* can be laid out freely. The first and second components 180*ij*A, 180*ij*B collectively form the pattern-processing circuit 180*ij*. The routing channel 182, 184, 186 are formed to provide coupling between different components 180*ij*A, 180*ij*B, or between different pattern-processing circuits. Because the pitch of the pattern-processing circuit 180*ij* is four times as much as the pitch of the memory arrays 170*ij* (along the x direction), the pattern-processing circuit 180*ij* is eight times larger than the footprints of the memory arrays 18*ij* and therefore, has even more complex functionalities.

The preferred bi-sided pattern processor 100 can be either processor-like or storage-like. The processor-like pattern processor 100 acts like a bi-sided processor with an embedded search-pattern library. It searches a target pattern from the input 110 against the search-pattern library. To be more specific, the memory array 170 stores at least a portion of the search-pattern library (e.g. a virus library, a keyword library, an acoustic/language model library, an image model library); the input 110 includes a target pattern (e.g. a network packet, a computer file, audio data, or image data); the pattern-processing circuit 180 performs pattern processing on the target pattern with the search pattern. Because a large number of the SPU's 100*ij* (thousands to tens of thousands, referring to FIG. 1A) support massive parallelism and the inter-surface connections 160 has a large bandwidth (referring to FIG. 2C), the preferred bi-sided processor with an embedded search-pattern library can achieve fast and efficient search.

Accordingly, the present invention discloses a bi-sided processor with an embedded search-pattern library, comprising: an input for transferring at least a portion of a target pattern; a plurality of storage-processing units (SPU's) communicatively coupled with said input, each of said SPU's comprising at least a memory array and a pattern-processing circuit, wherein said memory array stores at least a portion of a search pattern, said pattern-processing circuit performs pattern processing on said target pattern with said search pattern; a semiconductor substrate with first and second surfaces, wherein said memory array is disposed on said first surface, said pattern-processing circuit is disposed on said second surface, said memory array and said pattern-processing circuit are communicatively coupled by a plurality of inter-surface connections.

The storage-like pattern processor 100 acts like a bi-sided storage with in-situ pattern-processing capabilities. Its primary purpose is to store a target-pattern database, with a secondary purpose of searching the stored target-pattern database for a search pattern from the input 110. To be more specific, a target-pattern database (e.g. computer files on a whole disk drive, a big-data database, an audio archive, an image archive) is stored and distributed in the memory arrays 170; the input 110 include at least a search pattern (e.g. a virus signature, a keyword, a model); the pattern-processing circuit 180 performs pattern processing on the target pattern with the search pattern. Because a large number of the SPU's 100*ij* (thousands to tens of thousands, referring to FIG. 1A) support massive parallelism and the inter-surface connections 160 has a large bandwidth (referring to FIG. 2C), the preferred bi-sided storage can achieve a fast speed and a good efficiency.

Like the flash memory, a large number of the preferred bi-sided storages 100 can be packaged into a storage card (e.g. an SD card, a TF card) or a solid-state drive (i.e. SSD). These storage cards or SSD can be used to store massive data in the target-pattern database. More importantly, they have in-situ pattern-processing (e.g. searching) capabilities. Because each SPU 100*ij* has its own pattern-processing circuit 180, it only needs to search the data stored in the local memory array 170 (i.e. in the same SPU 100*ij*). As a result, no matter how large is the capacity of the storage card or the SSD, the processing time for the whole storage card or the whole SSD is similar to that for a single SPU 100*ij*. In other words, the search time for a database is irrelevant to its size, mostly within seconds.

In comparison, for the conventional von Neumann architecture, the processor (e.g. CPU) and the storage (e.g. HDD) are physically separated. During search, data need to be read out from the storage first. Because of the limited bandwidth between the CPU and the HDD, the search time for a database is limited by the read-out time of the database. As a result, the search time for the database is proportional to its size. In general, the search time ranges from minutes to hours, even longer, depending on the size of the database. Apparently, the preferred bi-sided storage with in-situ pattern-processing capabilities 100 has great advantages in database search.

When the preferred bi-sided storage 100 performs pattern processing for a large database (i.e. target-pattern database), the pattern-processing circuit 180 could just perform partial pattern processing. For example, the pattern-processing circuit 180 only performs a preliminary pattern processing (e.g. code matching, or string matching) on the database. After being filtered by this preliminary pattern-processing step, the remaining data from the database are sent through the output 120 to an external processor (e.g. CPU, GPU) to complete the full pattern processing. Because most data are filtered out by this preliminary pattern-processing step, the data output from the preferred bi-sided storage 100 are a small fraction of the whole database. This can substantially alleviate the bandwidth requirement on the output 120.

Accordingly, the present invention discloses a bi-sided storage with in-situ pattern-processing capabilities, comprising: an input for transferring at least a portion of a search pattern; a plurality of storage-processing units (SPU's) communicatively coupled with said input, each of said SPU's comprising at least a memory array and a pattern-processing circuit, wherein said memory array stores at least a portion of a target pattern, said pattern-processing circuit performs pattern processing on said target pattern with said search pattern; a semiconductor substrate with first and second surfaces, wherein said memory array is disposed on said first surface, said pattern-processing circuit is disposed on said second surface, said memory array and said pattern-processing circuit are communicatively coupled by a plurality of inter-surface connections.

In the following paragraphs, applications of the preferred bi-sided pattern processor 100 are described. The fields of applications include: A) information security; B) big-data analytics; C) speech recognition; and D) image recognition. Examples of the applications include: a) information-security processor; b) anti-virus storage; c) data-analysis processor; d) searchable storage; e) speech-recognition processor; f) searchable audio storage; g) image-recognition processor; h) searchable image storage.

A) Information Security

Information security includes network security and computer security. To enhance network security, virus in the network packets needs to be scanned. Similarly, to enhance computer security, virus in the computer files (including computer software) needs to be scanned. Generally speaking, virus (also known as malware) includes network viruses, computer viruses, software that violates network rules, document that violates document rules and others. During virus scan, a network packet or a computer file is compared against the virus patterns (also known as virus signatures) in a virus library. Once a match is found, the portion of the network packet or the computer file which contains the virus is quarantined or removed.

Nowadays, the virus library has become large. It has reached hundreds of MB. On the other hand, the computer data that require virus scan are even larger, typically on the order of GB or TB, even bigger. On the other hand, each processor core in the conventional processor can typically check a single virus pattern once. With a limited number of cores (e.g. a CPU contains tens of cores; a GPU contains hundreds of cores), the conventional processor can achieve limited parallelism for virus scan. Furthermore, because the processor is physically separated from the storage in a von Neumann architecture, it takes a long time to fetch new virus patterns. As a result, the conventional processor and its associated architecture have a poor performance for information security.

To enhance information security, the present invention discloses several bi-sided pattern processors 100. It could be processor-like or storage-like. For processor-like, the preferred bi-sided pattern processor 100 is an information-security processor, i.e. a processor for enhancing information security; for storage-like, the preferred bi-sided pattern processor 100 is an anti-virus storage, i.e. a storage with in-situ anti-virus capabilities.

a) Information-Security Processor

To enhance information security, the present invention discloses an information-security processor 100. It searches a network packet or a computer file for various virus patterns in a virus library. If there is a match with a virus pattern, the network packet or the computer file contains the virus. The preferred information-security processor 100 can be installed as a standalone processor in a network or a computer; or, integrated into a network processor, a computer processor, or a computer storage.

In the preferred information-security processor 100, the memory arrays 170 in different SPU 100*ij* stores different virus patterns. In other words, the virus library is stored and distributed in the SPU's 100*ij* of the preferred information-security processor 100. Once a network packet or a computer file is received at the input 110, at least a portion thereof is sent to all SPU's 100*ij*. In each SPU 100*ij*, the pattern-processing circuit 180 compares said portion of data against the virus patterns stored in the local memory array 170. If there is a match with a virus pattern, the network packet or the computer file contains the virus.

The above virus-scan operations are carried out by all SPU's 100*ij* at the same time. Because it comprises a large number of SPU's 100*ij* (thousands to tens of thousands), the preferred information-security processor 100 achieves massive parallelism for virus scan. Furthermore, because the inter-surface connections 160 are numerous and the pattern-processing circuit 180 is physically close to the memory arrays 170 (compared with the conventional von Neumann architecture), the pattern-processing circuit 180 can easily fetch new virus patterns from the local memory array 170. As a result, the preferred information-security processor 100 can perform fast and efficient virus scan. In this preferred embodiment, the pattern-processing circuit 180 is a code-matching circuit.

Accordingly, the present invention discloses a bi-sided information-security processor, comprising: an input for transferring at least a portion of data from at least a network packet or a computer file; a plurality of storage-processing units (SPU's) communicatively coupled with said input, each of said SPU's comprising at least a memory array and a code-matching circuit, wherein said memory array stores at least a portion of a virus pattern, said code-matching circuit searches said virus pattern in said portion of data; a semiconductor substrate with first and second surfaces, wherein said memory array is disposed on said first surface, said code-matching circuit is disposed on said second surface, said memory array and said code-matching circuit are communicatively coupled by a plurality of inter-surface connections.

b) Anti-Virus Storage

Whenever a new virus is discovered, the whole disk drive (e.g. hard-disk drive, solid-state drive) of the computer needs to be scanned against the new virus. This full-disk scan process is challenging to the conventional von Neumann architecture. Because a disk drive could store massive data, it takes a long time to even read out all data, let alone scan virus for them. For the conventional von Neumann architecture, the full-disk scan time is proportional to the capacity of the disk drive.

To shorten the full-disk scan time, the present invention discloses an anti-virus storage. Its primary function is a computer storage, with in-situ virus-scanning capabilities as its secondary function. Like the flash memory, a large number of the preferred anti-virus storage 100 can be packaged into a storage card or a solid-state drive for storing massive data and with in-situ virus-scanning capabilities.

In the preferred anti-virus storage 100, the memory arrays 170 in different SPU 100$ij$ stores different data. In other words, massive computer files are stored and distributed in the SPU's 100$ij$ of the storage card or the solid-state drive. Once a new virus is discovered and a full-disk scan is required, the pattern of the new virus is sent as input 110 to all SPU's 100$ij$, where the pattern-processing circuit 180 compares the data stored in the local memory array 170 against the new virus pattern.

The above virus-scan operations are carried out by all SPU's 100$ij$ at the same time and the virus-scan time for each SPU 100$ij$ is similar. Because of the massive parallelism, no matter how large is the capacity of the storage card or the solid-state drive, the virus-scan time for the whole storage card or the whole solid-state drive is more or less a constant, which is close to the virus-scan time for a single SPU 100$ij$ and generally within seconds. On the other hand, the conventional full-disk scan takes minutes to hours, or even longer. In this preferred embodiment, the pattern-processing circuit 180 is a code-matching circuit.

Accordingly, the present invention discloses a bi-sided anti-virus storage, comprising: an input for transferring at least a portion of a virus pattern; a plurality of storage-processing units (SPU's) communicatively coupled with said input, each of said SPU's comprising at least a memory array and a code-matching circuit, wherein said memory array stores at least a portion of data from a computer file, said code-matching circuit searches said virus pattern in said portion of data; a semiconductor substrate with first and second surfaces, wherein said memory array is disposed on said first surface, said code-matching circuit is disposed on said second surface, said memory array and said code-matching circuit are communicatively coupled by a plurality of inter-surface connections.

B) Big-Data Analytics

Big data is a term for a large collection of data, with main focus on unstructured and semi-structure data. An important aspect of big-data analytics is keyword search (including string matching, e.g. regular-expression matching). At present, the keyword library becomes large, while the big-data database is even larger. For such large keyword library and big-data database, the conventional processor and its associated architecture can hardly perform fast and efficient keyword search on unstructured or semi-structured data.

To improve the speed and efficiency of big-data analytics, the present invention discloses several bi-sided pattern processors 100. It could be processor-like or storage-like. For processor-like, the preferred bi-sided pattern processor 100 is a data-analysis processor, i.e. a processor for performing analysis on big data; for storage-like, the preferred bi-sided pattern processor 100 is a searchable storage, i.e. a storage with in-situ searching capabilities.

c) Data-Analysis Processor

To perform fast and efficient search on the input data, the present invention discloses a data-analysis processor 100. It searches the input data for the keywords in a keyword library. In the preferred data-analysis processor 100, the memory arrays 170 in different SPU 100$ij$ stores different keywords. In other words, the keyword library is stored and distributed in the SPU's 100$ij$ of the preferred data-analysis processor 100. Once data are received at the input 110, at least a portion thereof is sent to all SPU's 100$ij$. In each SPU 100$ij$, the pattern-processing circuit 180 compares said portion of data against various keywords stored in the local memory array 170.

The above searching operations are carried out by all SPU's 100$ij$ at the same time. Because it comprises a large number of SPU's 100$ij$ (thousands to tens of thousands), the preferred data-analysis processor 100 achieves massive parallelism for keyword search. Furthermore, because the inter-surface connections 160 are numerous and the pattern-processing circuit 180 is physically close to the memory arrays 170 (compared with the conventional von Neumann architecture), the pattern-processing circuit 180 can easily fetch keywords from the local memory array 170. As a result, the preferred data-analysis processor 100 can perform fast and efficient search on unstructured data or semi-structured data.

In this preferred embodiment, the pattern-processing circuit 180 is a string-matching circuit. The string-matching circuit could be implemented by a content-addressable memory (CAM) or a comparator including XOR circuits. Alternatively, keyword can be represented by a regular expression. In this case, the sting-matching circuit 180 can be implemented by a finite-state automata (FSA) circuit.

Accordingly, the present invention discloses a bi-sided data-analysis processor, comprising: an input for transferring at least a portion of data from a big-data database; a plurality of storage-processing units (SPU's) communicatively coupled with said input, each of said SPU's comprising at least a memory array and a string-matching circuit, wherein said memory array stores at least a portion of a keyword, said string-matching circuit searches said keyword in said portion of data; a semiconductor substrate with first and second surfaces, wherein said memory array is disposed on said first surface, said string-matching circuit is disposed on said second surface, said memory array and said string-matching circuit are communicatively coupled by a plurality of inter-surface connections.

d) Searchable Storage

Big-data analytics often requires full-database search, i.e. to search a whole big-data database for a keyword. The full-database search is challenging to the conventional von Neumann architecture. Because the big-data database is large, with a capacity of GB to TB, or even larger, it takes a long time to even read out all data, let alone analyze them. For the conventional von Neumann architecture, the full-database search time is proportional to the database size.

To improve the speed and efficiency of full-database search, the present invention discloses a searchable storage. Its primary function is database storage, with in-situ searching capabilities as its secondary function. Like the flash memory, a large number of the preferred searchable storage 100 can be packaged into a storage card or a solid-state drive for storing a big-data database and with in-situ searching capabilities.

In the preferred searchable storage 100, the memory arrays 170 in different SPU 100$ij$ stores different portions of the big-data database. In other words, the big-data database is stored and distributed in the SPU's 100$ij$ of the storage card or the solid-state drive. During search, a keyword is sent as input 110 to all SPU's 100$ij$. In each SPU 100$ij$, the pattern-processing circuit 180 searches the portion of the big-data database stored in the local memory array 170 for the keyword.

The above searching operations are carried out by all SPU's 100$ij$ at the same time and the keyword-search time for each SPU 100$ij$ is similar. Because of massive parallelism, no matter how large is the capacity of the storage card or the solid-state drive, the keyword-search time for the whole storage card or the whole solid-state drive is more or less a constant, which is close to the keyword-search time for a single SPU 100$ij$ and generally within seconds. On the other hand, the conventional full-database search takes minutes to hours, or even longer. In this preferred embodiment, the pattern-processing circuit 100 is a string-matching circuit.

Accordingly, the present invention discloses a bi-sided searchable storage, comprising: an input for transferring at least a portion of a keyword; a plurality of storage-processing units (SPU's) communicatively coupled with said input, each of said SPU's comprising at least a memory array and a string-matching circuit, wherein said memory array stores at least a portion of data from a big-data database, said string-matching circuit searches said keyword in said portion of data; a semiconductor substrate with first and second surfaces, wherein said memory array is disposed on said first surface, said string-matching circuit is disposed on said second surface, said memory array and said string-matching circuit are communicatively coupled by a plurality of inter-surface connections.

C) Speech Recognition

Speech recognition enables the recognition and translation of spoken language. It is primarily implemented through pattern recognition between audio data and an acoustic model/language library, which contains a plurality of acoustic models or language models. During speech recognition, the pattern processing circuit 180 performs speech recognition to the user's audio data by finding the nearest acoustic/language model in the acoustic/language model library. Because the conventional processor (e.g. CPU, GPU) has a limited number of cores and the acoustic/language model database is stored externally, the conventional processor and the associated architecture have a poor performance in speech recognition.

e) Speech-Recognition Processor

To improve the performance of speech recognition, the present invention discloses a speech-recognition processor 100. In the preferred speech-recognition processor 100, the user's audio data is sent as input 110 to all SPU 100$ij$. The memory arrays 170 store at least a portion of the acoustic/language model. In other words, an acoustic/language model library is stored and distributed in the SPU's 100$ij$. The pattern-processing circuit 180 performs speech recognition on the audio data from the input 110 with the acoustic/language models stored in the memory arrays 170. In this preferred embodiment, the pattern-processing circuit 180 is a speech-recognition circuit.

Accordingly, the present invention discloses a bi-sided speech-recognition processor, comprising: an input for transferring at least a portion of audio data; a plurality of storage-processing units (SPU's) communicatively coupled with said input, each of said SPU's comprising at least a memory array and a speech-recognition circuit, wherein said memory array stores at least a portion of an acoustic/language model, said speech-recognition circuit performs pattern recognition on said portion of audio data with said acoustic/language model; a semiconductor substrate with first and second surfaces, wherein said memory array is disposed on said first surface, said speech-recognition circuit is disposed on said second surface, said memory array and said speech-recognition circuit are communicatively coupled by a plurality of inter-surface connections.

f) Searchable Audio Storage

To enable audio search in an audio database (e.g. an audio archive), the present invention discloses a searchable audio storage. In the preferred searchable audio storage 100, an acoustic/language model derived from the audio data to be searched for is sent as input 110 to all SPU 100$ij$. The memory arrays 170 store at least a portion of the user's audio database. In other words, the audio database is stored and distributed in the SPU's 100$ij$ of the preferred searching audio storage 100. The pattern-processing circuit 180 performs speech recognition on the audio data stored in the memory arrays 170 with the acoustic/language model from the input 110. In this preferred embodiment, the pattern-processing circuit 180 is a speech-recognition circuit.

Accordingly, the present invention discloses a bi-sided searchable audio storage, comprising: an input for transferring at least a portion of an acoustic/language model; a plurality of storage-processing units (SPU's) communicatively coupled with said input, each of said SPU's comprising at least a memory array and a speech-recognition circuit, wherein said memory array stores at least a portion of audio data, said speech-recognition circuit performs pattern recognition on said portion of audio data with said acoustic/language model; a semiconductor substrate with first and second surfaces, wherein said memory array is disposed on said first surface, said speech-recognition circuit is disposed on said second surface, said memory array and said speech-recognition circuit are communicatively coupled by a plurality of inter-surface connections.

D) Image Recognition or Search

Image recognition enables the recognition of images. It is primarily implemented through pattern recognition on image data with an image model, which is a part of an image model library. During image recognition, the pattern processing circuit 180 performs image recognition to the user's image data by finding the nearest image model in the image model library. Because the conventional processor (e.g. CPU, GPU) has a limited number of cores and the image model database is stored externally, the conventional processor and the associated architecture have a poor performance in image recognition.

g) Image-Recognition Processor

To improve the performance of image recognition, the present invention discloses an image-recognition processor 100. In the preferred image-recognition processor 100, the user's image data is sent as input 110 to all SPU 100$ij$. The memory arrays 170 store at least a portion of the image model. In other words, an image model library is stored and distributed in the SPU's 100$ij$. The pattern-processing circuit 180 performs image recognition on the image data from the input 110 with the image models stored in the memory arrays 170. In this preferred embodiment, the pattern-processing circuit 180 is an image-recognition circuit.

Accordingly, the present invention discloses a bi-sided image-recognition processor, comprising: an input for transferring at least a portion of image data; a plurality of storage-processing units (SPU's) communicatively coupled with said input, each of said SPU's comprising at least a memory array and an image-recognition circuit, wherein said memory array stores at least a portion of an image model, said image-recognition circuit performs pattern recognition on said portion of image data with said image model; a semiconductor substrate with first and second surfaces, wherein said memory array is disposed on said first surface, said image-recognition circuit is disposed on said second surface, said memory array and said image-recognition circuit are communicatively coupled by a plurality of inter-surface connections.

h) Searchable Image Storage

To enable image search in an image database (e.g. an image archive), the present invention discloses a searchable image storage. In the preferred searchable image storage 100, an image model derived from the image data to be searched for is sent as input 110 to all SPU 100ij. The memory arrays 170 store at least a portion of the user's image database. In other words, the image database is stored and distributed in the SPU's 100ij of the preferred searchable image storage 100. The pattern-processing circuit 180 performs image recognition on the image data stored in the memory arrays 170 with the image model from the input 110. In this preferred embodiment, the pattern-processing circuit 180 is an image-recognition circuit.

Accordingly, the present invention discloses a bi-sided searchable image storage, comprising: an input for transferring at least a portion of an image model; a plurality of storage-processing units (SPU's) communicatively coupled with said input, each of said SPU's comprising at least a memory array and an image-recognition circuit, wherein said memory array stores at least a portion of image data, said image-recognition circuit performs pattern recognition on said portion of image data with said image model; a semiconductor substrate with first and second surfaces, wherein said memory array is disposed on said first surface, said image-recognition circuit is disposed on said second surface, said memory array and said image-recognition circuit are communicatively coupled by a plurality of inter-surface connections.

While illustrative embodiments have been shown and described, it would be apparent to those skilled in the art that many more modifications than that have been mentioned above are possible without departing from the inventive concepts set forth therein. The invention, therefore, is not to be limited except in the spirit of the appended claims.

What is claimed is:

1. A bi-sided pattern processor, comprising:
an input for transferring at least a first portion of a first pattern;
a plurality of storage-processing units (SPU's) communicatively coupled with said input, each of said SPU's comprising at least a memory array and a pattern-processing circuit, wherein said memory array stores at least a second portion of a second pattern, said pattern-processing circuit performs pattern processing for said first and second patterns;
a semiconductor substrate with first and second surfaces, wherein said memory array is disposed on said first surface, said pattern-processing circuit is disposed on said second surface, said memory array and said pattern-processing circuit are communicatively coupled by a plurality of inter-surface connections.

2. The pattern processor according to claim 1, wherein said memory array includes a RAM array.

3. The pattern processor according to claim 2, wherein said RAM array is a SRAM array or DRAM array.

4. The pattern processor according to claim 1, wherein said memory array includes a ROM array.

5. The pattern processor according to claim 4, wherein said ROM array is a mask-ROM array, an OTP array, an EPROM array, an EEPROM array, a flash array, or a 3-D memory (3D-M) array.

6. The pattern processor according to claim 1, wherein the projection of said memory array on said second surface at least partially overlaps said pattern-processing circuit.

7. The pattern processor according to claim 1, wherein each memory array is vertically aligned and communicatively coupled with a pattern-processing circuit.

8. The pattern processor according to claim 1, wherein each pattern-processing circuit is vertically aligned and communicatively coupled with at least a memory array.

9. The pattern processor according to claim 1, the pitch of said pattern-processing circuit is an integer multiple of the pitch of said memory array.

10. The pattern processor according to claim 1, said inter-surface connections are through-silicon vias (TSV's).

11. The pattern processor according to claim 1 being a bi-sided processor with an embedded search-pattern library, wherein said first pattern includes a target pattern and said second pattern includes a search pattern.

12. The pattern processor according to claim 1 being a bi-sided information-security processor, wherein said input transfers at least a portion of data from a network packet or a computer file; said memory array stores at least a portion of a virus pattern; and, said pattern-processing circuit is a code-matching circuit for searching said virus pattern in said portion of data.

13. The pattern processor according to claim 1 being a bi-sided data-analysis processor, wherein said input transfers at least a portion of data from a big-data database; said memory array stores at least a portion of a keyword; and, said pattern-processing circuit is a string-matching circuit for searching said keyword in said portion of data.

14. The pattern processor according to claim 1 being a bi-sided speech-recognition processor, wherein said input transfers at least a portion of audio data; said memory array stores at least a portion of an acoustic/language model; and, said pattern-processing circuit is a speech-recognition circuit for performing speech recognition on said portion of audio data with said acoustic/language model.

15. The pattern processor according to claim 1 being a bi-sided image-recognition processor, wherein said input transfers at least a portion of image data; said memory array stores at least a portion of an image model; and, said pattern-processing circuit is an image-recognition circuit for performing image recognition on said portion of image data with said image model.

16. The pattern processor according to claim 1 being a bi-sided storage with in-situ pattern-processing capabilities, wherein said first pattern is a search pattern and said second pattern is a target pattern.

17. The pattern processor according to claim 1 being a bi-sided anti-virus storage, wherein said input transfers at least a portion of a virus pattern; said memory array stores at least a portion of data from a computer file; and, said pattern-processing circuit is a code-matching circuit for searching said virus pattern in said portion of data.

18. The pattern processor according to claim 1 being a bi-sided searchable storage, wherein said input transfers at least a portion of a keyword; said memory array stores at least a portion of data from a big-data database; and, said pattern-processing circuit is a string-matching circuit for searching said keyword in said portion of data.

19. The pattern processor according to claim 1 being a bi-sided searchable audio storage, wherein said input transfers at least a portion of an acoustic/language model; said memory array stores at least a portion of audio data; and, said pattern-processing circuit is a speech-recognition circuit for performing speech recognition on said portion of audio data with said acoustic/language model.

20. The pattern processor according to claim 1 being a bi-sided searchable image storage, wherein said input transfers at least a portion of an image model; said memory array stores at least a portion of image data; and, said pattern-processing circuit is an image-recognition circuit for performing image recognition on said portion of image data with said image model.

* * * * *